United States Patent
Park et al.

(10) Patent No.: US 9,777,421 B2
(45) Date of Patent: Oct. 3, 2017

(54) CONTROL PANEL AND CLOTHES TREATING APPARATUS HAVING THE SAME

(71) Applicant: LG Electronics Inc., Seoul (KR)

(72) Inventors: Youngbae Park, Seoul (KR); Jihun Kim, Seoul (KR); Daekwon Lee, Seoul (KR); Jonghwa Kim, Seoul (KR); Suyoung Yoon, Seoul (KR)

(73) Assignee: LG Electronics Inc., Seoul (KR)

(*) Notice: Subject to any disclaimer, the term of this patent is extended or adjusted under 35 U.S.C. 154(b) by 444 days.

(21) Appl. No.: 14/243,112

(22) Filed: Apr. 2, 2014

(65) Prior Publication Data

US 2014/0298865 A1 Oct. 9, 2014

(30) Foreign Application Priority Data

Apr. 4, 2013 (KR) .......................... 10-2013-0036829

(51) Int. Cl.
*D06F 39/00* (2006.01)
*H03K 17/96* (2006.01)

(52) U.S. Cl.
CPC ......... *D06F 39/005* (2013.01); *H03K 17/962* (2013.01); *H01H 2221/062* (2013.01); *H01H 2239/074* (2013.01); *H03K 2217/96076* (2013.01); *H03K 2217/96077* (2013.01); *H03K 2217/96079* (2013.01)

(58) Field of Classification Search
CPC .................................................. D06F 39/005
See application file for complete search history.

(56) References Cited

U.S. PATENT DOCUMENTS

| 4,380,007 | A | 4/1983 | Steinegger |
| 7,741,858 | B2 | 6/2010 | Jeong |
| 8,669,502 | B2 | 3/2014 | Shigeoka |
| 2007/0285872 | A1 | 12/2007 | Jeong |
| 2011/0234527 | A1 | 9/2011 | Borges |

(Continued)

FOREIGN PATENT DOCUMENTS

| CN | 101098138 A | 1/2008 |
| CN | 201294509 Y | 8/2009 |
| CN | 101741371 A | 6/2010 |

(Continued)

OTHER PUBLICATIONS

European Search Report dated Mar. 3, 2015 for Application No. 14162356.1, 10 pages.

(Continued)

*Primary Examiner* — Jason Ko
(74) *Attorney, Agent, or Firm* — Fish & Richardson P.C.

(57) ABSTRACT

Disclosed are a control panel provided on an apparatus to control the apparatus and a clothes treating apparatus having the same. The clothes treating apparatus includes a includes a cabinet; a drum provided within the cabinet and configured to receive clothes; a driving unit that rotates the drum; a power supply unit that supplies power to the driving unit; and a control panel located on the cabinet. The control panel includes a panel body that defines the external appearance of the control panel; a printed circuit board (PCB) located adjacent to the panel body; input units; and an anti-separation unit located on at least one of the panel body and the PCB and configured to restrict the connection damper from being separated from the bar.

17 Claims, 4 Drawing Sheets

(56) References Cited

U.S. PATENT DOCUMENTS

2012/0118714 A1    5/2012  Shigeoka

FOREIGN PATENT DOCUMENTS

| CN | 202818265 U | 3/2013 |
| EP | 2 045 923 A1 | 4/2009 |
| EP | 2 461 645 A1 | 6/2012 |
| GB | 2076972 A | 12/1981 |
| JP | 2010-183940 | 8/2010 |
| KR | 10-2008-0020846 | 3/2008 |
| KR | 10-2012-0060741 | 6/2012 |
| WO | WO 2008/035838 A1 | 3/2008 |
| WO | WO 2011/013330 A1 | 2/2011 |

OTHER PUBLICATIONS

Notice of Allowance issued in Korean Application No. 10-2013-0036829 on Apr. 28, 2016, 3 pages, with translation.

CONTROL PANEL AND CLOTHES TREATING APPARATUS HAVING THE SAME

CROSS REFERENCE TO RELATED APPLICATION

Pursuant to 35 U.S.C. §119(a), this application claims the benefit of Korean Patent Application No. 10-2013-0036829, filed on Apr. 4, 2013, which is hereby incorporated by reference as if fully set forth herein.

FIELD

The present disclosure relates to a control panel provided on an apparatus to control the apparatus, and more particularly, to a control panel of an electric home appliance, particularly, a clothes treating apparatus, and a clothes treating apparatus having the control panel.

BACKGROUND

In general, a clothes treating apparatus is an apparatus which removes various contaminants attached to clothes and bedclothes (a target to be washed) using emulsion action of detergent and frictional force and impulsive force of a water current due to rotation of a pulsator (or a drum).

Further, clothes treating apparatuses include an electric home appliance capable of drying laundry and an electric home appliance capable of washing and drying laundry as well as an electric home appliance capable of washing laundry.

A conventional clothes treating apparatus includes a control panel provided on a cabinet forming the external appearance of the clothes treating apparatus so as to input a control command, such as a washing course.

The control panel includes input units including buttons (having physical shapes) to select one of courses and to give a command to execute and stop the selected course, and a display unit to display the control command input through the input unit or a washing process of laundry to be washed.

SUMMARY

According to an innovative aspect of the subject matter described in this specification may be embodied in a clothes treating apparatus that includes a cabinet; a drum provided within the cabinet and configured to receive clothes; a driving unit that rotates the drum; a power supply unit that supplies power to the driving unit; and a control panel located on the cabinet. The control panel includes a panel body that defines the external appearance of the control panel; a printed circuit board (PCB) located adjacent to the panel body; input units, each of which includes a contact part located on the panel body and configured to receive bioelectric currents of a user; a bar fixed to the PCB and located below the contact part; and a connection damper located between the contact part and the bar and electrically connecting the contact part and the bar; and an anti-separation unit located on at least one of the panel body and the PCB and configured to restrict the connection damper from being separated from the bar.

These and other embodiments can each optionally include one or more of the following features. The anti-separation unit includes at least one of (i) an upper guider located above the connection damper and abutting the connection damper or (ii) a lower guider located below the connection damper and abutting the connection damper. The anti-separation unit includes the lower guider and the lower guider extends from the PCB toward the connection damper and substantially surrounds an outer circumferential surface of a lower portion of the connection damper. The lower guider includes a bar housing having an upper surface (i) oriented substantially parallel to the panel body, (ii) fixed to the PCB, and (iii) surrounding an outer circumferential surface of the bar; and a flange located on the upper surface of the bar housing and surrounding the outer circumferential surface of the lower portion of the connection damper.

The control panel further includes a character display unit that displays control commands that are selectable by a user through the input units and are on the panel body; a light emission unit fixed to the PCB and located under the character display unit; and a light emission unit housing fixing the light emission unit to the PCB, where the lower guider is located on the light emission unit housing. The anti-separation unit includes the upper guider and the upper guider is substantially integrated with the panel body and extends downward toward the connection damper. The upper guider substantially surrounds an outer circumferential surface of an upper portion of the connection damper. The control panel further includes an assistant panel fixed to a lower portion of the panel body, where through holes are defined through the assistant panel and are located under each contact part. Each of the through holes is adjacent to the outer circumferential surface of the connection damper.

The control panel further includes spacers, each of which extends from the panel body downward toward the connection damper and separates the connection damper and the contact part by a designated distance. A respective spacer is configured to pass through a respective through hole. Each of the spacers includes a support surface contacting the connection damper. The upper guider includes a protrusion protruding from the support surface and configured to surround the outer circumferential surface of the connection damper. Each of the spacers further includes a connection bar connecting the support surface and the contact part.

The control panel further includes spacers that are substantially integrated with the panel body, each of the spacers extending from the panel body downward toward the connection damper and separating the connection damper and the contact part by a designated distance, where an upper guider is located at a lower portion of each of the spacers. The contact part includes a conductor passing through the panel body. The contact part is formed from insulating plastic having a thickness of 2.7 millimeters to 3.0 millimeters. Each of the input units further include a boundary part that is configured to define a closed curve surrounding an outer circumferential surface of the contact part. The boundary part is a conductor and fixed to the panel body.

According to another innovative aspect of the subject matter described in this specification may be embodied in a clothes treating apparatus that includes a cabinet; a drum located within the cabinet and configured to accommodate clothes; a driving unit that rotates the drum; a power supply unit that supplies power to the driving unit; and a control panel provided with input units through which a user inputs a control command. The control panel includes a panel body that defines the external appearance of the control panel; a character display unit that displays control commands that are selectable by the user through the input units and are on the panel body; a printed circuit board (PCB) located below the panel body and provided with a controller; light emission units fixed to the PCB, controlled by a controller, and provided under the character display unit; and a light emission unit housing fixed to the PCB and configured to support the light emission units, where each of the input units includes a contact part located on the panel body and configured to receive bioelectric currents of the user; a bar fixed to the PCB and located below the contact part; a connection damper located between the contact part and the bar and electrically connecting the contact part and the bar; and an anti-separation unit configured to restrict the connection damper from separating from the bar, where the anti-separation unit is located on the light emission unit housing and includes a lower guider that is provided below the connection damper and that abuts (i) the outer circumferential surface of the bar and (ii) the outer circumferential surface of a lower portion of the connection damper.

DETAILED DESCRIPTION

Figure 1:
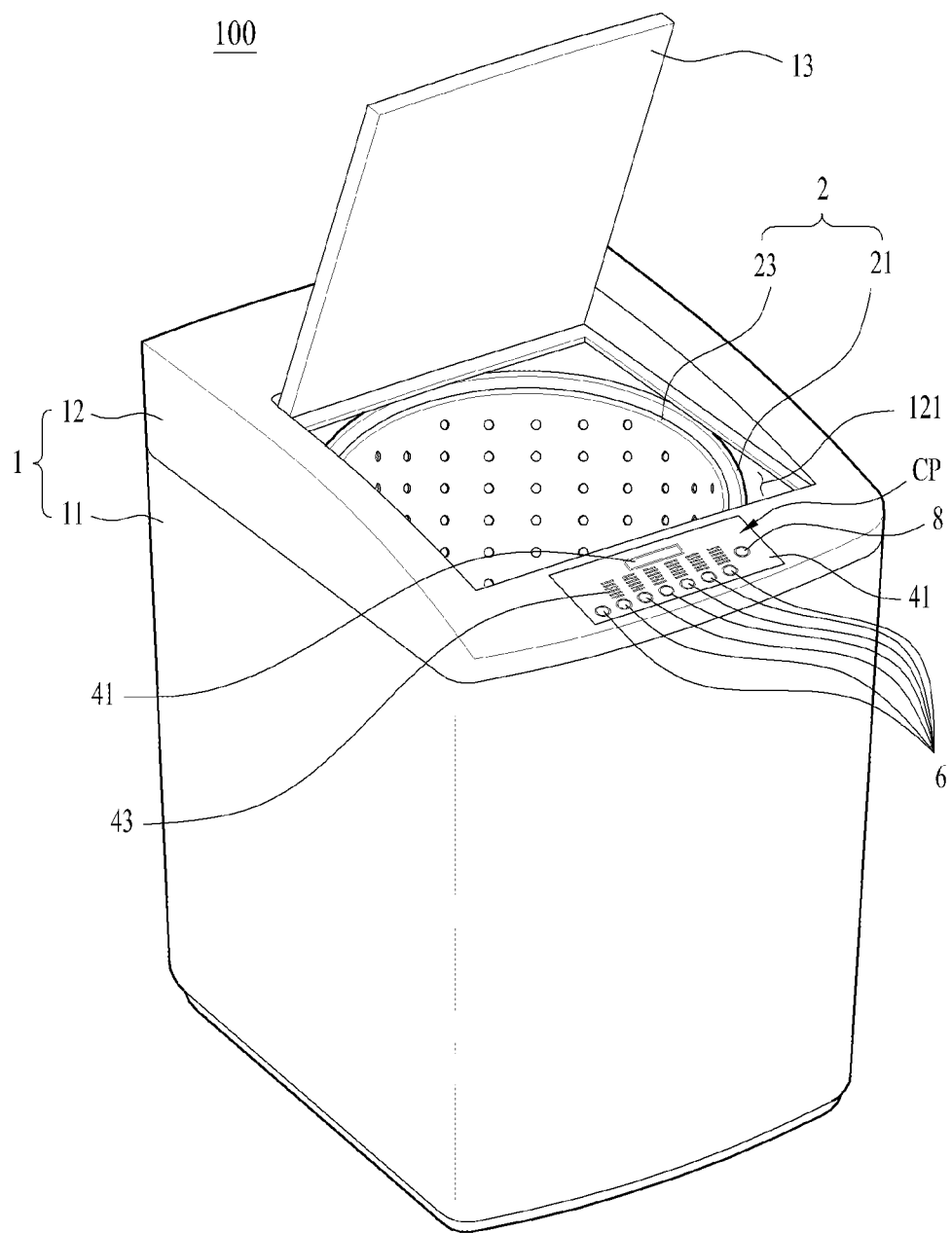
FIGS. 1 and 2 are views illustrating an example clothes treating apparatus having a control panel.

As shown in FIG. 1, a clothes treating apparatus 100 may include a cabinet 1 forming the external appearance of the clothes treating apparatus 100, a clothes receipt unit 2 provided within the cabinet 1 to receive clothes, and a control panel CP provided on the cabinet 1 so that a user may input a control command to the clothes treating apparatus 100 through the control panel CP.

The cabinet 1 may include a cabinet body 11 having a hexahedral shape, the upper surface of which is opened, and a cover 12 provided on the opened surface of the cabinet body 11.

An inlet 121 is provided on the cover 12, and a user may put clothes into or withdraw clothes from the clothes receipt unit 2 through the inlet 121. The inlet 121 may be opened and closed by a door 13 rotatably combined with the cover 12.

Figure 2:
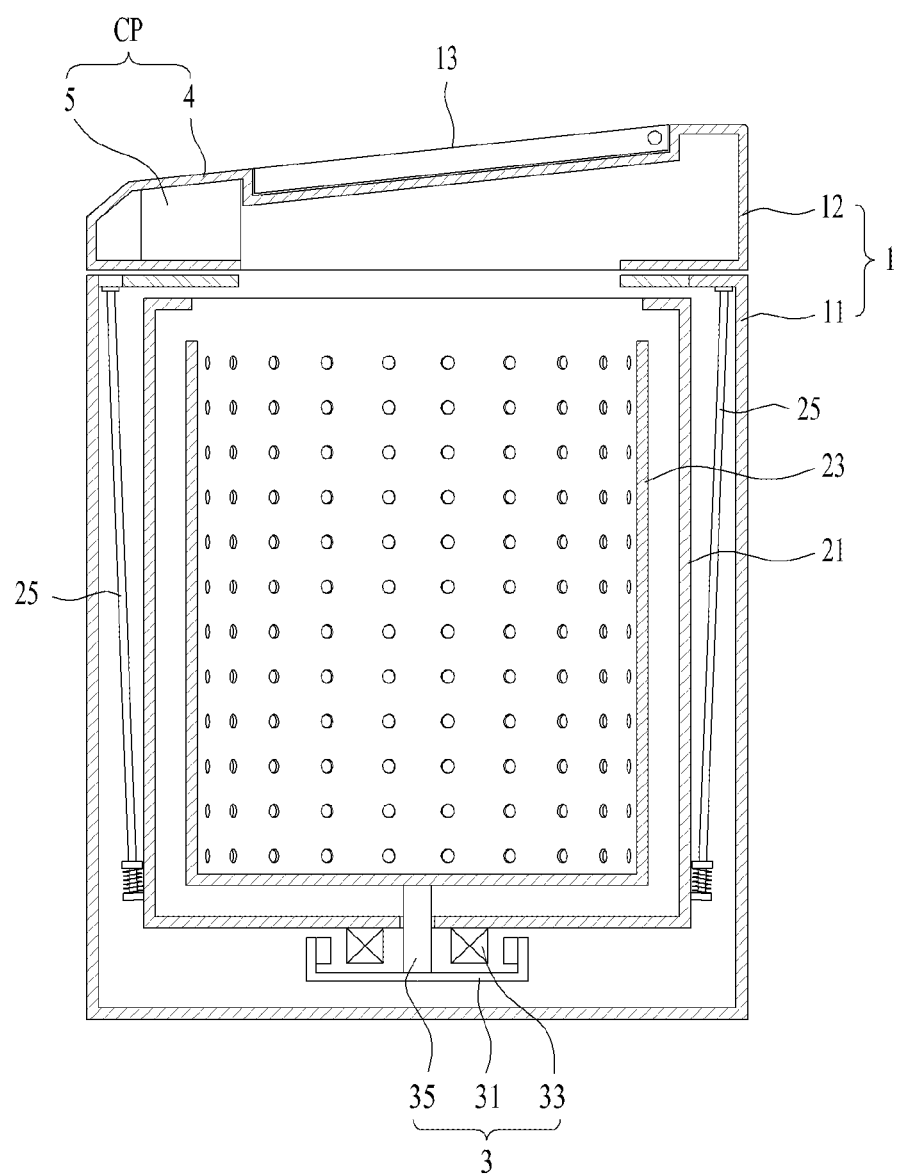

As shown in FIG. 2, the clothes receipt unit 2 may include a tub (or outer tub) 21 provided within the cabinet 1 and storing wash water, and a drum (or inner tub) 23 rotatably provided within the tub 21 and receiving clothes.

The tub 21 is fixed to the inside of the cabinet 1 by tub support units 25 connecting the inner circumferential surface of the cabinet 1 and the outer circumferential surface of the tub 21, and the tub support units 25 may be provided as structures (springs or dampers) capable of absorbing vibration generated by the tub 21.

The tub 21 may receive wash water supplied through a water supply unit and discharge wash water in the tub 21 to the outside of the tub 21 through a drain unit.

The water supply unit may include water supply hoses connecting a water supply source provided at the outside of the clothes treating apparatus 100 to the tub 21, and water supply valves opening and closing the water supply hoses under the control of a control unit.

The drain unit may include a drain hose communicating the inside of the tub 21 with the outside of the cabinet 1, and a drain pump provided in the drain hose.

A plurality of through holes, through which wash water stored in the tub 21 is introduced into the drum 23 or wash water in the drum 23 is discharged to the tub 21, is provided on the drum 23 and the drum 23 is rotated by a driving unit 3, such as a motor.

The driving unit 3 may include a stator 33 fixed to the outside of the tub 21, a rotor 31 located at the outside of the tub 21 and rotated by electromagnetic interaction with the stator 33, and a rotary shaft 35 connecting the rotor 31 to the drum 23.

In some implementations, the rotary shaft 35 passes through the bottom surface of the tub 21 and is fixed to the bottom surface of the drum 23, and a bearing assembly which prevents leakage of wash water in the tub 21 and rotatably supports the rotary shaft 35 may be provided on the tub 21.

Figure 3:
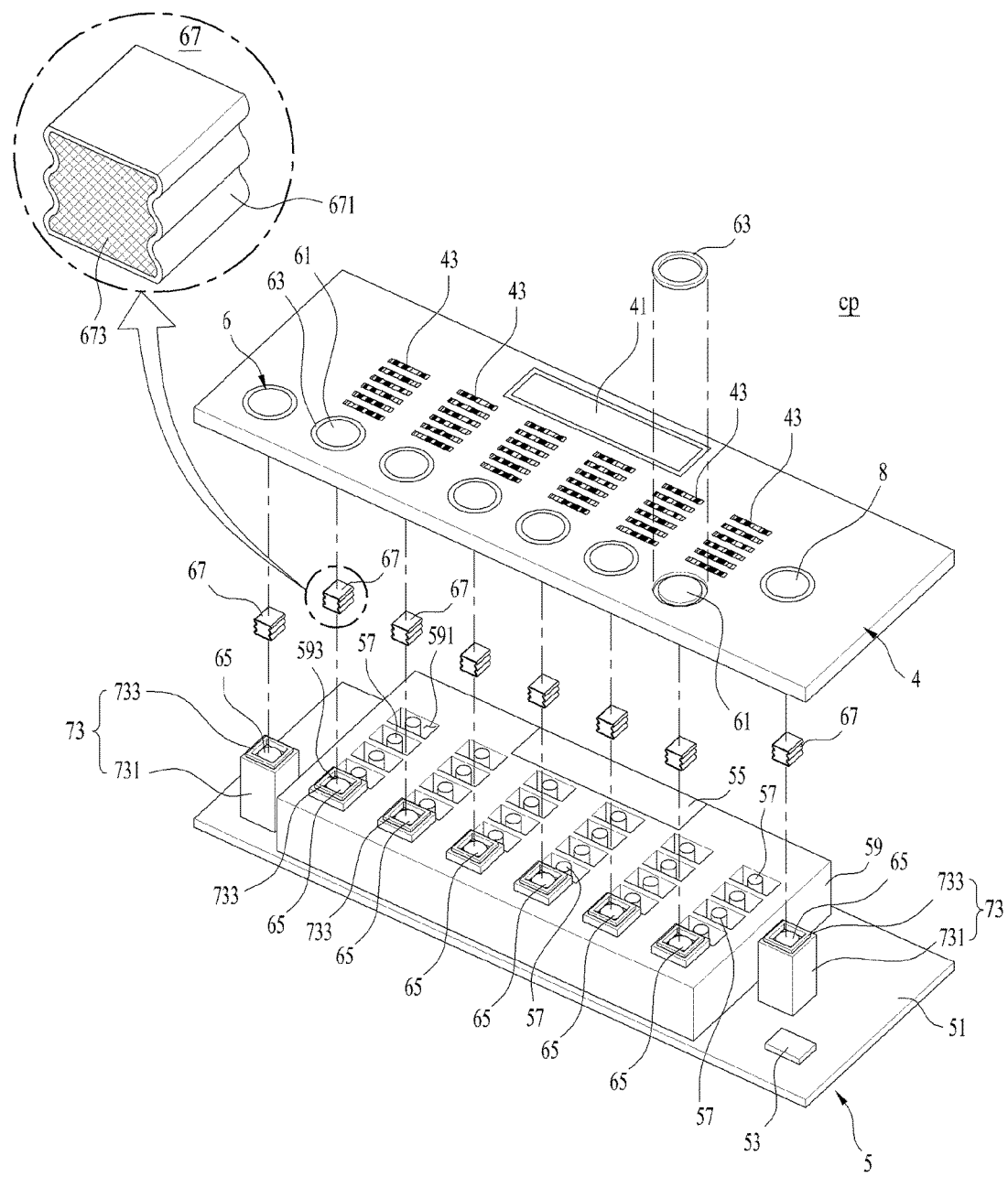
FIG. 3 is an exploded perspective view of an example control panel.

As shown in FIG. 3, the control panel CP may include a panel body 4 provided on the surface of the cabinet 1 (i.e., the upper surface or the front surface of the cover 12), a control unit 5 fixed to the inside of the cabinet 1 and located under the panel body 4, and input units 6 transmitting a control command input by a user to the control unit 5.

The panel body 4 may be provided as a plate and include a transparent window 41 and character display units 43.

The panel body 4 may be inserted into a hole formed through the cover 12 so as to be coplanar with the surface of the cover 12, or be provided by forming the transparent window 41 and the character display units 43 on the surface of the cover 12.

The transparent window 41 may be provided in various forms so that a user may confirm an object located under the panel body 4, and be provided by forming a part of the panel body 4 of a transparent material.

The character display units 43 display control commands (courses, a supplied water amount, a drum rotation time, a supplied water temperature, a drum rotational speed, etc.) which are selectable by a user through the input units 6 on the surface of the panel body 4 and may be printed on the surface of the panel body 4.

In some implementations, the surface of the panel body 4 may be coated or painted with a material of an achromatic color or a chromatic color, the character display units 43 may be formed by coating or painting the region of the panel body 4 except for characters or marks desired to be displayed with the material of the achromatic color or the chromatic color. Therefore, if light is transmitted by regions in which characters or marks are displayed, these characters or marks may be clearly recognized. Further, if light is not transmitted, particularly, if the region of the panel body 4 is painted or coated with a black material, the panel body 4 may be recognized as if there is no character or mark.

The control unit 5 may include a printed circuit board (PCB) 51 including a controller 53 operating the clothes treating apparatus 100 according to a control command input through the input units 6, a display unit 55 fixed to the PCB 51, controlled by the controller 53, and located under the transparent window 41, and light emission units 57 (LEDs, etc.) fixed to the PCB 51, controlled by the controller 53, and located under the character display units 43. Of course, the control panel CP may include the control unit 5 or constituent elements of the control unit 5.

The display unit 55 serves to display operation information of the clothes treating apparatus 100. For example, the operation information may be information related to a course selected by a user, such as a time set in the course (a washing course, a drying course, etc.) selected by the user through the input units 6 and a residual time of the course selected by the user.

The light emission units 57 serve to emit light toward the character display units 43 so that a user may recognize the character display units 43.

That is, when the user inputs a control command through the input units 6, the controller 53 supplies current to the light emission unit 57 located under the character display unit 43 corresponding to the control command selected by the user (the light emission unit 57 emitting light) so that the character display unit 43 corresponding to the control command selected by the user becomes brighter than other character display units 43.

Further, the light emission units 57 may be supported by a light emission unit housing 59 fixed to the PCB 51.

The light emission unit housing 59 may include a plurality of reception holes 591 formed through the light emission unit housing 59 and surrounding the outer circumferential surfaces of the light emission units 57.

When the light emission units 57 are inserted into the reception holes 591 and combined with the PCB 51, light emitted from one light emission unit 57 may be supplied only to the light discharge unit 43 located above such a light emission unit 57, thus improving visibility.

That is, discharge of light to light discharge units 43 other than the light discharge unit 43 located above the light emission unit 57 emitting light may be minimized.

Each of the input units 6 may include a contact part 61 provided on the surface of the panel body 4 so that bioelectric currents of a user may be input to the contact part 61, a bar 65 electrically connected to the controller 53 and fixed to the PCB 51, and a connection damper 67 electrically connecting the bar 65 and the contact part 61.

The bar 65 may be formed of a conductor, fixed to the PCB 51, and located below the contact part 61.

The contact part 61 may be formed of any material which may transmit the bioelectric currents of the user to the connection damper 67. That is, the contact part 61 may be formed of a conductor passing through the panel body 4, or formed of an insulator having a small thickness.

Since such an insulator having a small thickness is not a perfect insulator which completely cuts off electrical conduction, even if the contact part 61 is formed of an insulator of less than a designated thickness, bioelectric currents of the user may be transmitted to the connection damper 67. For example, the applicant has confirmed that the function of the input unit 6 may be implemented through the contact part 61 formed of plastic having a thickness of 2.7 to 3.0 millimeters.

Further, if the contact part 61 is formed of an insulator having a small thickness, the input unit 6 may further include a boundary part 63 in the form of a closed curve surrounding the outer circumferential surface of the contact part 61.

The boundary part 63 may be formed of a conductor fixed to the surface of the panel body 4 so as to surround the outer circumferential surface of the contact part 61. The reason for this is to concentrate the bioelectric currents of the user on the boundary part 63 formed of the conductor and thus to prevent the bioelectric currents from moving to the outside of the contact part 61.

The connection damper 67 may be fixed to the upper surface of the bar 65. Further, the connection damper 67 may include a conductor 671 connecting the contact part 61 and the bar 65.

If the connection damper 67 includes the conductor 671 alone, manufacturing costs of the control panel CP increases and, when impact is applied to the control panel CP, the connection damper 67 may be broken.

Therefore, the connection damper 67 may further include an elastic body 673. In some implementations, the outer circumferential surface of the elastic body 673 may be surrounded with the conductor 671.

As shown in FIG. 3, the control panel CP may include a plurality of input units 6. Each input unit 6 is provided to select one of the character display units 43 located at the column where the corresponding input unit 6 is located.

That is, for example, when a user's body contacts an input unit 6, the uppermost character display unit 43 alone among the character display units 43 of the column where the input unit 6 is located may be brightened and when the user's body contacts the input unit 6 one more time, the character display unit 43 alone under the uppermost character display unit 43 may be brightened. The above-described control may be executed by controlling the input units 6 and the light emission units 57 by the controller 53.

The panel body 4 may further include a power input unit 8 controlling supply of power or cutoff of power supply to a constituent element requiring power supply, such as the driving unit 3 or the control unit 5.

In some implementations, the structure of the power input unit 8 may be the same as the above-described structure of the input units 6.

Hereinafter, the structures of the input units 6 and the control panel CP including the same will be described in more detail, with reference to FIGS. 4(a) to 4(d).

Figure 4:
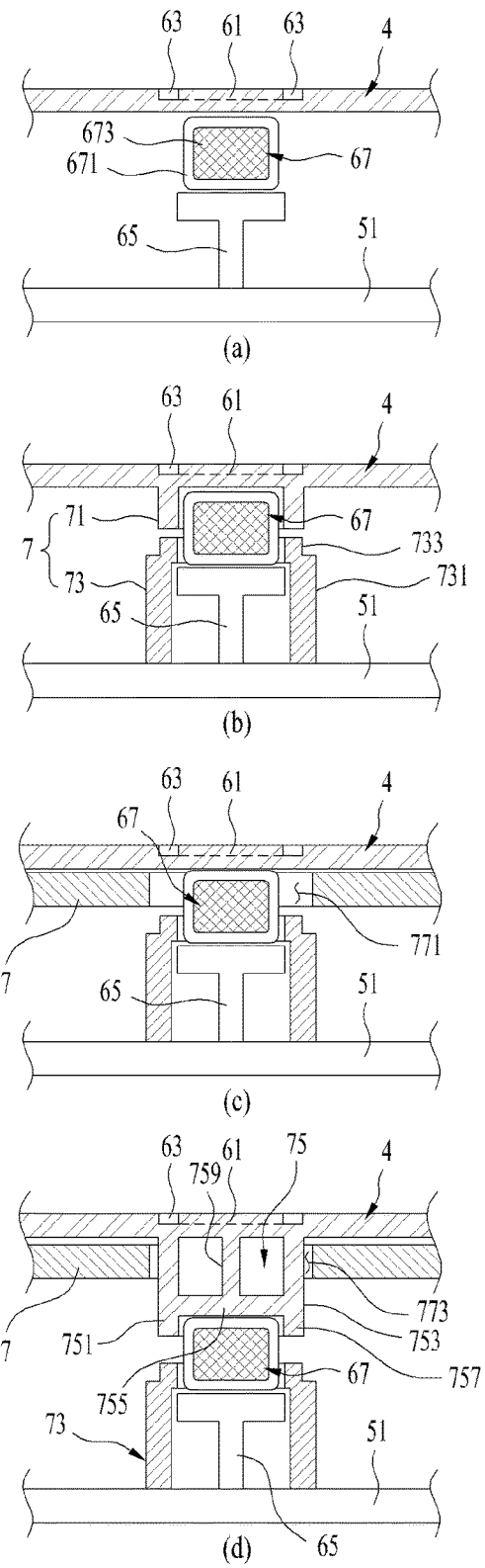
FIGS. 4(a) to 4(d) are cross-sectional views of an example control panel.

As shown in FIG. 4(a), when external force is applied to the control panel CP having only the above-described constituent elements, there is a danger that the connection damper 67 may be separated from the bar 65. The reason for this is that, when external force is input to the control panel CP, the panel body 4 or the PCB 51 may move. Due to such separation of the connection damper 67, user input through the contact part 61 may not be effectively transmitted to the bar 65. Therefore, the connection damper 67 may be stably fixed.

For this purpose, an anti-separation unit 7 fixing the position of the connection damper 67 may be provided on at least one of the panel body 41 and the PCB 51. That is, each of the input units 6 or the control panel CP may further include the anti-separation unit 7 preventing the connection damper 67 from being separated from the bar 65.

In some implementations, the anti-separation unit 7 may have one of the forms shown in FIGS. 4(b) to 4(d).

The anti-separation unit 7 may be provided on at least one of the panel body 4 and the PCB 51. That is, the anti-separation unit 7 may include at least one of an upper guider 71 provided above the connection damper 67 to prevent separation of the connection damper 67 from the bar 65 and a lower guider 73 provided below the connection damper 67 to prevent separation of the connection damper 67 from the bar 65. Of course, the anti-separation unit 7 may include both of the upper guider 71 and the lower guider 73 from a function point of view.

First, the lower guider 73 will be described. Such a lower guider 73 may be applied to implementations shown in FIGS. 4(b) to 4(d) in common.

The lower guider 73 may be provided below the connection damper 67 so as to accommodate the connection damper 67. Further, the lower guider 73 may extend from the PCB 51 toward the connection damper 67 so as to surround the outer circumferential surface of the lower portion of the connection damper 67.

In more detail, a bar housing 731 extending from the PCB 51 toward the panel body 4 may be provided. That is, the bar housing 731 accommodating the bar 65 may be provided.

Further, a flange (lower flange) 733 provided at the upper end of the bar housing 731 and surrounding the outer circumferential surface of the connection damper 67 may be provided. Therefore, the lower guider 73 may include the bar housing 731 and the lower flange 733.

The bar housing 731 may be provided in the form of a pipe, opposite both ends of which are opened, and fixed to the surface of the PCB 51. The lower flange 733 is provided along the outer circumferential surface of the upper end of the bar housing 731 and surrounds the outer circumferential surface of the connection damper 67.

The bar housing 731 may be provided independently of the above-described light emission unit housing 59. That is, the bar housing 731 may be individually fixed to the PCB 51. However, the bar housing 731 may be formed integrally with the light emission unit housing 59. Therefore, the lower guider 73 may be provided on the light emission unit housing 59.

The light emission unit housing 59, the bar housings 731, and the lower guiders 73 may be formed into a single body, thus capable of being manufactured. That is, fixation of the light emission units, the bars 65, and the connection dampers 67 may be performed through single configuration.

Together with or apart from the lower guider 73, the upper guider 71 may be provided. The upper guider 71 may have the same structure as the lower guider 73 and prevent separation from the connection damper 67 from the bar 65. For example, the upper guider 71 may be provided so as to accommodate the outer circumferential surface of the connection damper 67. Of course, the upper guider 73 may be located above the connection damper 67.

Further, if both the lower guider 73 and the upper guider 71, as shown in FIGS. 4(b) to 4(d), a separation distance between the lower guider 73 and the upper guider 71 may be provided. Due to such a separation distance, the connection damper 67 is elastically deformable to absorb impact.

The upper guider 71 may be variously modified from the viewpoint of relations with other constituent elements as illustrated in FIGS. 4(b) to 4(d).

The upper guider 71 shown in FIG. 4(b) may be provided as a flange (upper flange) in the form of a pipe protruding from the lower surface of the panel body 4 toward the connection damper 67 and surrounding the contact part 61.

That is, the upper guider 71 may be provided by fixing the upper flange in the form of a pipe, having a diameter which is equal to or greater than the diameter of the boundary part 63, to the lower surface of the panel body 4.

The upper guider 71 may be formed integrally with the panel body 4 and extend downwardly toward the connection damper 67. Therefore, the upper guider 71 may be provided in the form of surrounding the outer circumferential surface of the upper portion of the connection damper 67.

As shown in FIG. 4(c), the control panel CP may include an assistant panel 77. Such an assistant panel 77 may function as an upper guider.

The assistant panel 77 may be provided as a plate fixed to the lower surface of the panel body 4 and reinforce rigidity of the panel body 4. However, the thickness of the control panel CP may be increased due to the assistant panel 77 but the total thickness of the contact part 61 may be increased thereby. Therefore, through holes 771 formed through the assistant panel 77 may be provided under the contact parts 61.

The outer circumferential surface of the connection damper 67 may be accommodated in the through hole 771. Particularly, the outer circumferential surface of the upper part of the connection damper 67 may be accommodated in the through hole 771. Therefore, the through holes 771 may be referred to as damper accommodation holes. The thickness of the through holes 771 may vary according to the thickness of the assistant panel 77. That is, the height of the damper accommodation holes 771 accommodating the connection dampers 67 may vary according to the thickness of the assistant panel 77.

Therefore, the upper guider may include the through hole (or damper accommodation hole) 771 formed through the assistant panel 77.

As shown in FIG. 4(d), a spacer 75 maintaining a designated interval between the connection damper 67 and the contact part 61 may be provided. If a separation distance between the contact part 61 and the bar 65 is long, particularly, if a separation distance between the panel body 4 and the PCB 51 is long, the spacer 75 may be provided to compensate for the long separation distance.

Further, an assistant panel 77 may be provided under the panel body 4.

The input unit 6 shown in FIG. 4(b) or 4(c) is provided so that an interval between the contact part 61 and the connection damper 67 is short (about three millimeters) or a contact state between the contact part 61 and the connection damper 67 is maintained. In this case, when the contact part 61 is broken due to external force, the connection damper 67 may be exposed to the outside of the panel body 4.

When a user's body contacts the broken contact part 61 under the condition that the connection damper 67 is exposed to the outside of the panel body 4, current supplied to the clothes treating apparatus 100 may be transmitted to the user. The above-described spacer 75 serves to solve such a problem and to electrically connect the contact part 61 and the connection damper 67.

In some implementations, the spacer 75 may extend from the panel body 4 toward the connection damper 67. The spacer 75 may include a support surface 755 provided in parallel with the panel body 4. Therefore, the support surface 755 may contact the connection damper 67. Further, the spacer 75 may include a first side wall 751 and a second side wall 753 provided opposite each other. The support surface 755 may be provided to connect the first side wall 751 and the second side wall 753.

In some implementations, the anti-separation unit 7 may include an upper guider provided on the outer circumferential surface of the support surface 755 and accommodating the outer circumferential surface (outer circumferential surface of the upper portion) of the connection damper 67.

As shown in FIG. 4(d), the upper guider may include a protrusion protruding from the outer circumferential surface of the support surface 755 toward the connection damper 67. The protrusion may be provided as a flange (upper flange) 757 in which the outer circumferential surface of the connection damper 67 is accommodated. Therefore, the upper guider may be implemented through the spacer 75 extending downwardly from the panel body 4 toward the connection damper 67 and separating the connection damper 67 and the contact part 61 by a designated distance.

Since the interval between the contact part 61 and the connection damper 67 may be increased (i.e., to seven millimeters or more) by the spacer 75, the control panel CP may further include a connection bar 759 connecting the contact part 61 and the support surface 755. The reason for this is to transmit bioelectric currents, supplied through the contact part 61, to the connection damper 67.

The interval between the contact part 61 and the connection damper 67 is increased by the spacer 75. Of course, such an interval may be not enough to prevent transmission of bioelectric currents between the contact part 61 and the connection damper 67. However, increase in the interval may mean that the moving time of charges is increased as much or movement of charges is difficult.

Therefore, the connection bar 759 may solve such a problem by minimizing the moving path of charges in the control panel CP having the spacers 75.

For this purpose, both the contact part 61 and the connection bar 759 may be formed of nonconductors but, if at least one of the contact part 61 and the connection bar 759 is formed of a conductor, the above-described function may be executed.

The connection bar 759 may extend downwardly from the central portion of the contact part 61. The reason for this is to transmit bioelectric currents through a portion on which bioelectric currents are most concentrated.

The support surface 755 is provided in parallel with the upper surface of the connection damper 67 and may thus stably transmit bioelectric currents through the largest area.

In some implementations, the control panel CP may further include an assistant panel 77 fixed to the lower portion of the panel body 4. In some implementations, the assistant panel 77 may include through holes 773 through which the spacers 75 passes.

The through hole 773 provided through the assistant panel 77 restricts the moving range of the spacer 75 when the panel body 4 moves and may thus prevent the connection damper 67 from being separated from the bar 65 due to movement of the panel body 4. Further, the spacer 75 may be formed integrally with the panel body 4.

Therefore, the panel body 4 and the assistant panel 77 may be more firmly combined through the through holes 773 of the assistant panel 77 and the spacers 75 passing through the through holes 773. Separation in the panel body 4 by external impact may be minimized by increase in rigidity of the panel body 4 due to assistant panel 77. Thereby, separation of the connection damper 67 from the bar 65 in the forward, backward, leftward, and rightward directions may be minimized. Therefore, the connection damper 67 may be more stably fixed.

In some implementations, the control panel CP is applied to the top loading type clothes treating apparatus in which the clothes receipt unit 2 is provided in a direction vertical to the bottom surface of the cabinet 1. In some implementations, the control panel CP may be applied to a front loading type clothes treating apparatus in which a clothes receipt unit 2 is provided in parallel with the bottom surface of a cabinet 1.

In some implementations, a control panel through which a control command may be input using bioelectric currents of a user and a clothes treating apparatus having the same may be provided In some implementations, a control panel which may stably transmit bioelectric currents of a user to a control unit even if external force is applied and a clothes treating apparatus having the same may be provided.

In some implementations, a control panel which is safe even if input units using bioelectric currents of a user are damaged and a clothes treating apparatus having the same may be provided.

In some implementations, a control panel which implements anti-separation units preventing separation of connection dampers from bars through a light emission unit housing and is thus manufactured and a clothes treating apparatus having the same may be provided.

In some implementations, a control panel which may sufficiently secure a distance between a contact part to which bioelectric currents of a user are input and a bar recognizing the bioelectric currents and stably transmit the bioelectric currents of the user and a clothes treating apparatus having the same may be provided.

What is claimed is:

1. A clothes treating apparatus comprising:
   a cabinet;
   a drum provided within the cabinet and configured to receive clothes;
   a driving unit that rotates the drum;
   a power supply unit that supplies power to the driving unit; and
   a control panel located on the cabinet, wherein the control panel includes:
      a panel body that defines the external appearance of the control panel;
      a printed circuit board (PCB) located adjacent to the panel body;
      input units, each of which includes:
         a contact part located on the panel body and configured to receive bioelectric currents of a user;
         a bar fixed to the PCB and located below the contact part; and
         a connection damper located between the contact part and the bar and electrically connecting the contact part and the bar; and
      an anti-separation unit located on at least one of the panel body and the PCB and configured to restrict the connection damper from being separated from the bar,
      wherein the anti-separation unit includes an upper guider that is located above the connection damper and that is configured to abut the connection damper, and
      wherein the upper guider is configured to substantially surround an outer circumferential surface of an upper portion of the connection damper.

2. The clothes treating apparatus of claim 1, wherein the anti-separation unit further includes a lower guider located below the connection damper and abutting the connection damper.

3. The clothes treating apparatus of claim 2, wherein the anti-separation unit includes the lower guider and the lower guider extends from the PCB toward the connection damper and substantially surrounds an outer circumferential surface of a lower portion of the connection damper.

4. The clothes treating apparatus of claim 3, wherein the lower guider includes:
   a bar housing having an upper surface (i) oriented substantially parallel to the panel body, (ii) fixed to the PCB, and (iii) surrounding an outer circumferential surface of the bar; and
   a flange located on the upper surface of the bar housing and surrounding the outer circumferential surface of the lower portion of the connection damper.

5. The clothes treating apparatus of claim 4, wherein the control panel further includes:
   a character display unit that displays control commands that are selectable by a user through the input units and are on the panel body;
   a light emission unit fixed to the PCB and located under the character display unit; and
   a light emission unit housing fixing the light emission unit to the PCB,
   wherein the lower guider is located on the light emission unit housing.

6. The clothes treating apparatus of claim 1, wherein the control panel further includes an assistant panel fixed to a lower portion of the panel body,
wherein through holes are defined through the assistant panel and are located under each contact part.

7. The clothes treating apparatus of claim 6, wherein the control panel further includes spacers, each of which extends from the panel body downward toward the connection damper and separates the connection damper and the contact part by a designated distance.

8. The clothes treating apparatus of claim 7, wherein a respective spacer is configured to pass through a respective through hole.

9. The clothes treating apparatus of claim 8, wherein each of the spacers includes a support surface contacting the connection damper.

10. The clothes treating apparatus of claim 9, wherein the upper guider includes a protrusion protruding from the support surface and configured to surround the outer circumferential surface of the connection damper.

11. The clothes treating apparatus of claim 9, wherein each of the spacers further includes a connection bar connecting the support surface and the contact part.

12. The clothes treating apparatus of claim 2, wherein the control panel further includes spacers that are substantially integrated with the panel body, each of the spacers extending from the panel body downward toward the connection damper and separating the connection damper and the contact part by a designated distance,
wherein an upper guider is located at a lower portion of each of the spacers.

13. The clothes treating apparatus of claim 1, wherein the contact part includes a conductor passing through the panel body.

14. The clothes treating apparatus of claim 1, wherein the contact part is formed from insulating plastic having a thickness of 2.7 millimeters to 3.0 millimeters.

15. The clothes treating apparatus of claim 14, wherein each of the input units further include a boundary part that is configured to define a closed curve surrounding an outer circumferential surface of the contact part.

16. The clothes treating apparatus of claim 15, wherein the boundary part is a conductor and fixed to the panel body.

17. A clothes treating apparatus comprising:
a cabinet;
a drum located within the cabinet and configured to accommodate clothes;
a driving unit that rotates the drum;
a power supply unit that supplies power to the driving unit; and
a control panel provided with input units through which a user inputs a control command, wherein the control panel includes:
a panel body that defines the external appearance of the control panel;
a character display unit that displays control commands that are selectable by the user through the input units and are on the panel body;
a printed circuit board (PCB) located below the panel body and provided with a controller;
light emission units fixed to the PCB, controlled by a controller, and provided under the character display unit; and
a light emission unit housing fixed to the PCB and configured to support the light emission units,
wherein each of the input units includes:
a contact part located on the panel body and configured to receive bioelectric currents of the user;
a bar fixed to the PCB and located below the contact part;
a connection damper located between the contact part and the bar and electrically connecting the contact part and the bar; and
an anti-separation unit configured to restrict the connection damper from separating from the bar,
wherein the anti-separation unit is located on the light emission unit housing, the anti-separation unit including:
a lower guider that is provided below the connection damper and that abuts (i) the outer circumferential surface of the bar and (ii) the outer circumferential surface of a lower portion of the connection damper; and
an upper guider that is located above the connection damper and that is configured to abut the connection damper, the upper guider being configured to substantially surround an outer circumferential surface of an upper portion of the connection damper.

* * * * *